(12) United States Patent
Tanaka et al.

(10) Patent No.: US 11,909,013 B2
(45) Date of Patent: Feb. 20, 2024

(54) DISPLAY SYSTEM, VEHICLE, AND METHOD OF DISPLAY OF STATUS OF SECONDARY BATTERY

(71) Applicant: TOYOTA JIDOSHA KABUSHIKI KAISHA, Toyota (JP)

(72) Inventors: Nobuyuki Tanaka, Toyota (JP); Yoshihiro Uchida, Nagakute (JP); Kazuki Kubo, Toyota (JP); Yusuke Funabashi, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 793 days.

(21) Appl. No.: 16/996,995

(22) Filed: Aug. 19, 2020

(65) Prior Publication Data

US 2021/0066765 A1    Mar. 4, 2021

(30) Foreign Application Priority Data

Aug. 30, 2019    (JP) ................. 2019-158630

(51) Int. Cl.
*H01M 10/48*    (2006.01)
*G01R 19/165*    (2006.01)
*G01R 31/382*    (2019.01)
*B60K 35/00*    (2006.01)

(52) U.S. Cl.
CPC ........ *H01M 10/48* (2013.01); *G01R 19/1659* (2013.01); *G01R 31/382* (2019.01); *B60K 35/00* (2013.01); *B60K 2370/1876* (2019.05)

(58) Field of Classification Search
CPC .......................... H01M 10/48; H01M 10/488; G01R 19/1659; G01R 31/382; G01R 31/007; G01R 31/3646; B60K 35/00; B60K 2370/1876; B60K 2370/152; B60K 2370/169; B60K 2370/52; Y02T 10/62;
(Continued)

(56) References Cited

U.S. PATENT DOCUMENTS

| 5,612,608 | A | 3/1997 | Ishiguro et al. |
| 9,041,740 | B2* | 5/2015 | Sugiyama ............. G02B 27/01 |
| | | | 345/633 |
| 10,013,951 | B2* | 7/2018 | Kuwabara .............. G09G 5/026 |

(Continued)

FOREIGN PATENT DOCUMENTS

DE    10 2012 208 301 A1    11/2012
DE    10 2017 106 908 A9    12/2017
(Continued)

*Primary Examiner* — M Baye Diao
(74) *Attorney, Agent, or Firm* — Sughrue Mion, PLLC

(57) ABSTRACT

A display system includes an instrument panel and an ECU for controlling the instrument panel so that the instrument panel displays an indication related to a battery. The ECU controls the instrument panel so that the instrument panel continuously displays a second indication. The ECU also controls instrument panel so that instrument panel does not display a first indication when a predetermined condition does not hold true, and displays the first indication when the predetermined condition holds true, the predetermined condition being a condition that a display-related user operation has been performed. The first indication can be prevented from being mistaken as the second indication, without requiring a display-related user operation.

10 Claims, 9 Drawing Sheets

(58) Field of Classification Search
CPC .......... Y02T 10/70; B60L 58/12; B60L 50/53; B60L 2250/16; B60Y 2200/91
USPC .......................................................... 320/132
See application file for complete search history.

(56) References Cited

U.S. PATENT DOCUMENTS

| | | | |
|---|---|---|---|
| 10,518,640 B2* | 12/2019 | Wada | H01M 10/488 |
| 10,538,161 B2* | 1/2020 | You | G01C 21/3697 |
| 10,836,268 B2* | 11/2020 | Kim | B60L 53/22 |
| 11,181,737 B2* | 11/2021 | Kubota | G02B 27/01 |
| 11,377,824 B2* | 7/2022 | Yamashita | H04N 13/363 |
| 11,639,138 B2* | 5/2023 | Shibata | B60R 1/12 |
| | | | 345/7 |
| 2003/0094321 A1 | 5/2003 | Hirata et al. | |
| 2012/0296504 A1 | 11/2012 | Haraki | |
| 2013/0076366 A1* | 3/2013 | Arizono | H02J 7/0048 |
| | | | 324/435 |
| 2014/0077941 A1* | 3/2014 | Yamamura | B60K 37/02 |
| | | | 340/438 |
| 2015/0066344 A1 | 3/2015 | Kikuchi et al. | |
| 2017/0282739 A1 | 10/2017 | Cha et al. | |
| 2017/0285108 A1* | 10/2017 | Yamada | G01R 31/386 |
| 2017/0326983 A1* | 11/2017 | You | G01C 21/3469 |
| 2018/0079303 A1* | 3/2018 | Gromotka | B60K 35/00 |
| 2021/0323419 A1* | 10/2021 | Maruno | H01M 10/488 |

FOREIGN PATENT DOCUMENTS

| | | |
|---|---|---|
| JP | 7-198808 A | 8/1995 |
| JP | 11-285155 A | 10/1999 |
| JP | 2003-164006 A | 6/2003 |
| JP | 2011-257213 A | 12/2011 |
| JP | 2013-017290 A | 1/2013 |
| JP | 2014-163680 A | 9/2014 |
| JP | 2017-28874 A | 2/2017 |
| KR | 10-1755504 B1 | 7/2017 |
| WO | 2013/157050 A1 | 10/2013 |

* cited by examiner

FIG.6
(A) UNDER NORMAL CONDITIONS
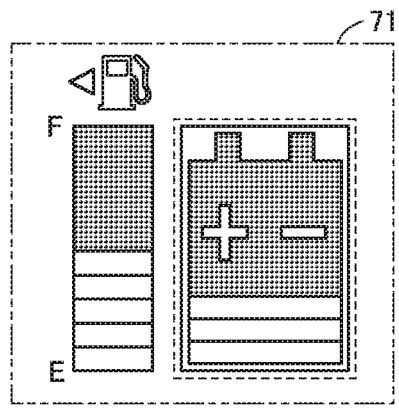
(B) WHEN PREDETERMINED CONDITION HOLDS TRUE
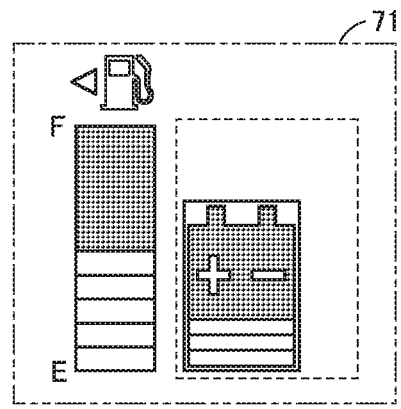

FIG.7

(A) UNDER NORMAL CONDITIONS

```
┌─────────────── 71
│ FUEL = 50%
│ SOC  = 40%
└───────────────
```

(B) WHEN PREDETERMINED CONDITION HOLDS TRUE

```
┌─────────────── 71
│ FUEL = 50%
│ SOC  = 40%
│ Q    = 10%
└───────────────
```

FIG.8

(A) UNDER NORMAL CONDITIONS

```
┌─────────────── 71
│ HV RANGE = 200km
│ EV RANGE = 8km
│ SOC      = 40%
└───────────────
```

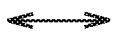

(B) WHEN PREDETERMINED CONDITION HOLDS TRUE

```
┌─────────────── 71
│ HV RANGE = 200km
│ EV RANGE = 8km
│ SOC      = 40%
│ FULL CHARGE EV RANGE = 20km
└───────────────
```

FIG.9

(A) UNDER NORMAL CONDITIONS

```
┌─────────────── 71
│ HV RANGE = 200km
│ EV RANGE = 8km
│ SOC 20.75 = 40%
└───────────────
```

(B) WHEN PREDETERMINED CONDITION HOLDS TRUE

```
┌─────────────── 71
│ HV RANGE = 200km
│ EV RANGE = 8km
│ SOC 20.75 = 40%
│ CAPACITY RETENTION = 10%
└───────────────
```

FIG.12

(A) UNDER NORMAL CONDITIONS

```
┌─────────────────┐ ╱71
│  SOC  = 40%     │
└─────────────────┘
```

(B) WHEN PREDETERMINED CONDITION HOLDS TRUE

```
┌─────────────────┐ ╱71
│  SOC  = 40%     │
│  Q    = 50%     │
└─────────────────┘
```

FIG.13

(A) UNDER NORMAL CONDITIONS

```
┌─────────────────┐ ╱71
│  RANGE = 100km  │
│  SOC   = 40%    │
└─────────────────┘
```

(B) WHEN PREDETERMINED CONDITION HOLDS TRUE

```
┌──────────────────────────────┐ ╱71
│  RANGE = 100km               │
│  SOC   = 40%                 │
│  FULL CHARGE RANGE = 250km   │
└──────────────────────────────┘
```

FIG.14

(A) UNDER NORMAL CONDITIONS

```
┌─────────────────┐ ╱71
│  RANGE = 100km  │
│  SOC   = 40%    │
└─────────────────┘
```

(B) WHEN PREDETERMINED CONDITION HOLDS TRUE

```
┌────────────────────────────────┐ ╱71
│  RANGE = 100km                 │
│  SOC   = 40%                   │
│  CAPACITY RETENTION = 50%      │
└────────────────────────────────┘
```

DISPLAY SYSTEM, VEHICLE, AND METHOD OF DISPLAY OF STATUS OF SECONDARY BATTERY

This nonprovisional application is based on Japanese Patent Application No. 2019-158630 filed on Aug. 30, 2019 with the Japan Patent Office, the entire content of which is hereby incorporated by reference.

BACKGROUND

Field

The present disclosure relates to a display system, a vehicle, and a method of display of a status of a secondary battery, and, more particularly, to a display system suitable for displaying an indication related to the secondary battery, a vehicle Which includes the display system, and a status display method suitable for displaying the indication related to the secondary battery.

Description of the Background Art

Status of charge (SOC) is widely used as an indication indicative of an amount of battery remaining (remaining capacity) in a secondary battery. The secondary battery deteriorates with use, and the full charge capacity of the secondary battery decreases.

In general, the full charge capacity and SOC of a secondary battery are less likely displayed simultaneously in the same screen of a display of an electronic device provided with the secondary battery. In many cases, only the SOC is displayed. However, if SOC and the full charge capacity of a secondary battery carried in a vehicle (electric vehicle, etc.) decrease, a distance which the vehicle can travel with the power stored in the secondary battery may excessively decrease. Due to this, there is a case where the full charge capacity and SOC are displayed together for the purposes of reducing user anxiety caused by the deteriorated secondary battery. For example, Japanese Patent Laying-Open No. 2011-257213 discloses a display which displays both the SOC and full charge capacity of a battery.

SUMMARY

As noted above, when the first indication indicative of flee state of health the secondary battery, such as the full charge capacity, and the second indication indicative of an amount of battery remained in the secondary battery, such as SOC, are displayed simultaneously on the same screen, it may be difficult for a user to intuitively be aware of distinction between the first indication and the second indication, such as the user being confused between the two. Moreover, in general, the second indication, such as SOC, has been more pervasive over the first indication, such as the full charge capacity, and thus the first indication may be misunderstood as the second indication. Due to this, the first indication may be mistaken as the second indication. The indication of the full charge capacity can be displayed together with SOC on a smartphone, by the user performing a predetermined operation. However, this requires the predetermined user operation. Thus, user effort is required to display the full charge capacity.

The present disclosure is made to solve the above problem, and an object of the present disclosure is to provide a display system, a vehicle, and a method of display of the status of a secondary battery, which can prevent, when the first indication indicative of the full charge capacity of the secondary battery and the second indication different from the first indication and related to the secondary battery are simultaneously displayed, the first indication from being mistaken as the second indication, without requiring a display-related user operation.

A display system according to the present disclosure includes: a display; and a controller that controls the display so that the display displays an indication related to a secondary battery. The controller: controls the display so that the display continuously displays a second indication which is related to the secondary battery and different from a first indication indicative of a full charge capacity of the secondary battery; and controls the display so that the display does not display the first indication when a predetermined condition does not hold true, and displays the first indication when the predetermined condition holds true, the predetermined condition being different from a condition that a display-related user operation has been performed.

According to such a configuration, the user is allowed to determine that the first indication that is displayed on the display when the predetermined condition holds true is different from the second indication and indicates the full charge capacity of the secondary battery. As a result, the display system can be provided which can prevent, when the first indication indicative of the full charge capacity of the secondary battery and the second indication different from the first indication are simultaneously displayed, the first indication from being mistaken as the second indication, without requiring a display-related user operation.

The second indication may be an indication indicative of an amount of battery remained in the secondary battery, and the controller may control the display so that the display displays the first indication in a same screen in which the second indication is displayed.

According to such a configuration, when the first indication indicative of the full charge capacity is displayed, the first indication is displayed in the same screen in Which the second indication indicative of the amount of battery remained in the secondary battery, is displayed. As a result, when the first indication indicative of the full charge capacity of the secondary battery and the second indication indicative of the amount of battery remained in the secondary battery are displayed in the same screen, the first indication can be prevented from being mistaken as the second indication.

The predetermined condition may be that it has been within a predetermined time period since update of display content of the first indication. According to such a configuration, the indication indicative of the full charge capacity is displayed when the display content of the indication indicative of the full charge capacity is updated. As a result, the user can be informed of the indication indicative of the full charge capacity when there is a change in the indication indicative of the full charge capacity of the secondary battery.

According to another aspect of the present disclosure, a vehicle includes the secondary battery and the display system described above. According to such a configuration, the vehicle can be provided which can prevent, when the first indication indicative of the full charge capacity of the secondary battery and the second indication different from the first indication are simultaneously displayed, the first indication from being mistaken as the second indication.

The predetermined condition may be that it has been within a predetermined time period since startup of the vehicle. According to such a configuration, even though the indication indicative of the full charge capacity is not updated, the indication indicative of the full charge capacity is displayed when the vehicle is started. As a result, users' concerns can be resolved, such as that he/she does not know whether the full charge capacity of the secondary battery is varying.

The predetermined condition may be that it has been within a predetermined time period since completion of charging of the secondary battery. According to such a configuration, even though the indication indicative of the full charge capacity is not updated, the indication indicative of the full charge capacity is displayed upon completion of charging of the secondary battery. As a result, users' concerns can be resolved, such as that he/she does not know whether the full charge capacity of the secondary battery is varying.

The controller may control the display so that the display displays, as the second indication, a cruising range for the vehicle with the amount of battery remained in the secondary battery. According to such a configuration, the user is allowed to know the amount of battery remained in the secondary battery, as a cruising range for the vehicle.

The controller may control the display so that the display displays, as the second indication, an SOC of the secondary battery and a cruising range for the vehicle with the amount of battery remained in the secondary battery. According to such a configuration, the user is allowed to know the amount of battery remained in the secondary battery, as a cruising range and SOC for the vehicle.

The controller may control the display so that the display displays, as the first indication, a cruising range for the vehicle at full charge of the secondary battery. According to such a configuration, the user is allowed to know the full charge capacity of the secondary battery as a cruising range for the vehicle at full charge.

According to still another aspect of the present disclosure, a method of display of a status of the secondary battery is a method for displaying an indication related to the secondary battery, the method including: controlling a display so that display continuously displays the second indication related to the secondary battery different from the first indication indicative of the full charge capacity of the secondary battery; and controlling the display so that the display does not display the first indication when a predetermined condition does not hold true, and displays the first indication when the predetermined condition holds true, the predetermined condition being different from a condition that a display-related user operation has been performed.

According to such a configuration, the method of display of the status of the secondary battery can be provided which can prevent, when the first indication indicative of the full charge capacity of the secondary battery and the second indication different from the first indication are simultaneously displayed, the first indication from being mistaken as the second indication, without requiring a display-related user operation.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 6 is a diagram illustrating an example indicator displayed on the instrument panel, according to Embodiment 1.

FIG. 7 is a diagram showing the indicator displayed on the instrument panel, according to Variation 1 of Embodiment 1.

FIG. 8 is a diagram showing the indicator displayed on the instrument panel, according to Variation 2 of Embodiment 1.

FIG. 9 is a diagram showing the indicator displayed on the instrument panel, according to Variation 3 of Embodiment 1.

FIG. 12 is a diagram showing the indicator displayed on the instrument panel, according to Variation 1 of Embodiment 2.

FIG. 13 is a diagram showing the indicator displayed on the instrument panel, according to Variation 2 of Embodiment 2.

FIG. 14 is a diagram showing the indicator displayed on the instrument panel, according to Variation 3 of Embodiment 2.

DESCRIPTION OF THE PREFERRED EMBODIMENTS

Hereinafter, the present embodiment will be described, with reference to the accompanying drawings. Note that the same reference signs are used to refer to the same or like parts, and the description will not be repeated.

Embodiment 1

<Overall Configuration of System>

Figure 1:
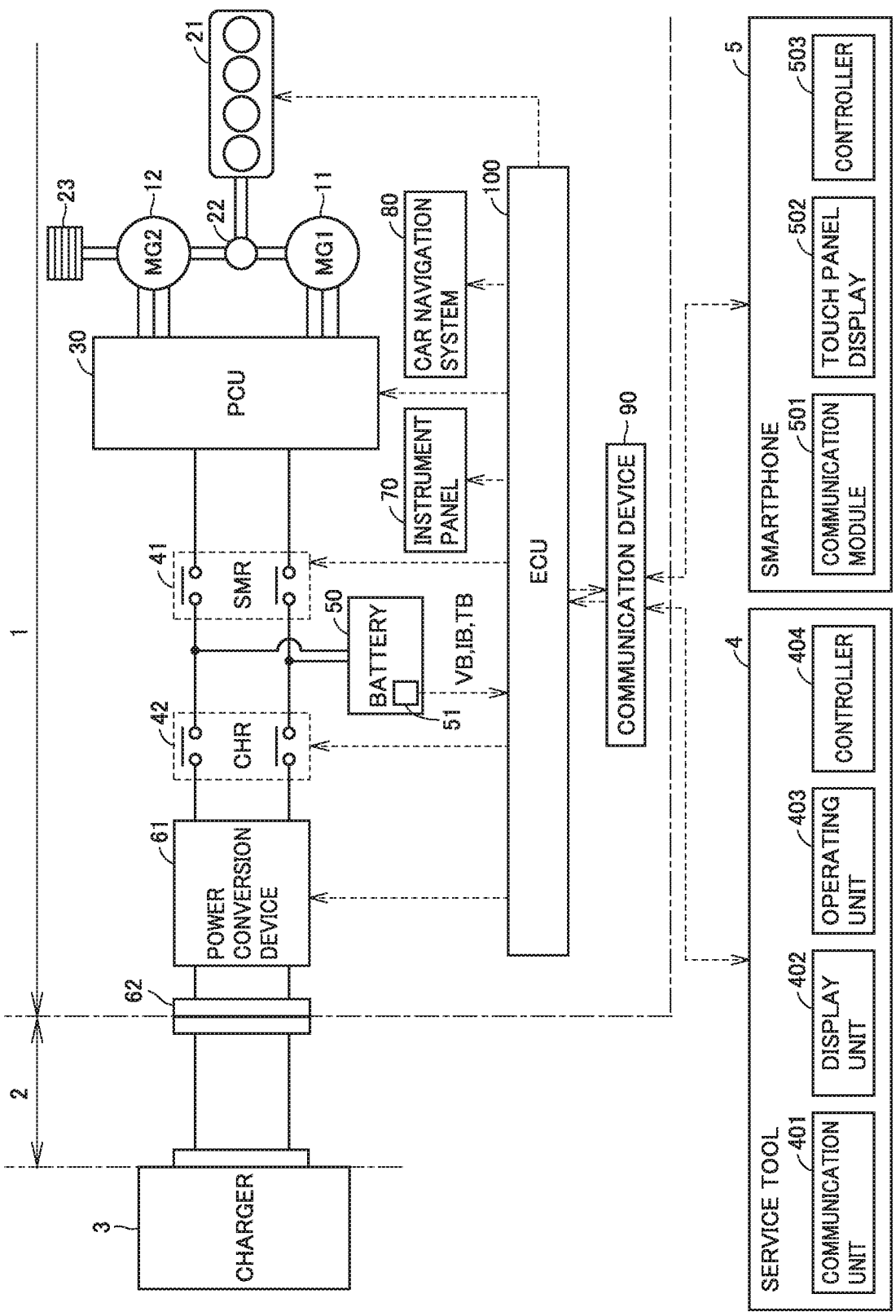
FIG. 1 is a diagram schematically showing an overall configuration of a system, including a vehicle according to Embodiment 1 of the present disclosure.

FIG. 1 is a diagram schematically showing of a system, including a vehicle, according to Embodiment 1 of the present disclosure. Referring to FIG. 1, a vehicle 1 is, for example, a plug-in hybrid vehicle, and capable of electrically connecting to a charger 3 through a charging cable 2. Vehicle 1 may be any vehicle carrying a secondary battery as a drive source, or a typical hybrid vehicle that is not capable of plug-in charging. Vehicle 1 may also be an electric vehicle or a fuel cell vehicle.

Vehicle 1 includes motor generators 11 and 12, an engine 21, a power split device 22, driving wheels 23, a power control unit (PCU) 30, a system main relay (SMR) 41, a charge relay 42, a battery 50, a power conversion device 61, an inlet 62, an instrument panel 70, a car navigation system 80, a communication device 90, and an electronic control unit (ECU) 100.

For example, motor generators 11 and 12 are each a three-phase AC rotating electric machine which includes a rotor (not shown) having a permanent-magnet embedded therein. Motor generator 11 is coupled to the crankshaft of engine 21 via power split device 22. Motor generator 11 uses the power from battery 50 to rotate the crankshaft of engine 21 to start engine 21. Motor generator 11 can also generate power using the mechanical power of engine 21. Alternate-current (AC) power generated by motor generator 11 is converted into direct-current (DC) power by PCU 30 and stored into battery 50. The AC power generated by motor generator 11 may also be supplied to motor generator 12.

Motor generator 12 uses at least one of the power from battery 50 and the power generated by motor generator 11 to rotate the drive shaft. Motor generator 12 is also capable of generating power by regenerative braking. The AC power generated by motor generator 12 is converted into DC power by PCU 30 and stored into battery 50.

Engine 21 is an internal combustion engine such as a gasoline engine, a diesel engine, etc. and generates mechanical power in response to a control signal from ECU 100, the mechanical power being power for allowing vehicle 1 to travel. Power split device 22 is, for example, a planetary gear mechanism. Power split device 22 divides the mechanical power generated by engine 21 into mechanical power to be transmitted to driving wheels 23 and mechanical power to be transmitted to motor generator 11.

In response to the control signal from ECU 100, PCU 30 converts the DC power stored in battery 50 into AC power and supplies the AC power to motor generators 11 and 12. PCU 30 also converts the AC power generated by motor generators 11 and 12 into DC power and supplies the DC power to battery 50.

SMR 41 is electrically connected to a power line connecting PCU 30 and battery 50. SMR 41 switches between supply and shutting off of power between PCU 30 and battery 50, in response to a control signal from ECU 100.

Charge relay 42 is electrically connected to a power line connecting battery 50 and power conversion device 61. Charge relay 42 switches between supply and shutting off of power between battery 50 and power conversion device 61, in response to a control signal from ECU 100.

Battery 50 is a DC power supply capable of charging and discharging power. A secondary battery, such as a lithium-ion secondary battery or a nickel-hydrogen battery, may be used as battery 50. Battery 50 supplies PCU 30 with power for generating the driving force for vehicle 1. Battery 50 also stores the power generated by motor generator 11.

Battery 50 includes a monitoring unit 51 for monitoring the status of battery 50. Monitoring unit 51 includes a voltage sensor for detecting a voltage VB of battery 50, and a current sensor for detecting a current IB input to/output from battery 50, and a temperature sensor for detecting a temperature TB of battery 50 (none of which are shown). Each sensor outputs a signal indicative of a result of the detection by the sensor to ECU 100. Based on the results of the detections by the voltage sensor and the current sensor, ECU 100 is capable of, for example, calculating SOC of battery 50, and calculating the full charge capacity of battery 50.

Power conversion device 61 includes, for example, an AC/DC converter (not shown). Power conversion device 61 converts the AC power supplied from charger 3 via charging cable 2 and inlet 62 into DC power and outputs the DC power to charge relay 42.

Instrument panel 70 is a dashboard in which meters are installed, and displays various statuses of vehicle 1, according to control by ECU 100. More specifically, instrument panel 70 displays the speedometer, the tachometer, the fuel gauge, the water temperature gauge, the tripmeter, and idiot lights, and also displays an indicator 71 indicative of the statuses of battery 50 (such as SOC and the full charge capacity).

Car navigation system 80 includes a global positioning system (GPS) receiver for locating the vehicle 1 based on a radio wave from an artificial satellite, and a touch panel monitor for receiving user operations and displaying various information (none of which are shown).

Communication device 90 is capable of wired or wireless two-way communications with a service tool 4. Communication device 90 is also capable of the two-way communications with the user's smartphone 5.

ECU 100 includes a central processing unit (CPU), a memory, and input/output ports (none of which are shown). ECU 100 may be divided into multiple ECUs by function. ECU 100 outputs a control signal, based on input of a signal from each sensor and maps and programs stored in the memory, and controls each device so that vehicle 1 is brought into a desired state. In the present embodiment, the main control that is performed by ECU 100 includes a "battery display process" in which SOC and the full charge capacity of battery 50 are calculated and indications regarding of the SOC and the full charge capacity are displayed on instrument panel 70, The battery display process will be described below in detail.

Service tool 4 is a dedicated terminal installed in a car dealer, auto repair shop, etc., and diagnoses the presence or absence of abnormality of vehicle 1 (including the status of battery 50). More specifically, service tool 4 includes a communication unit 401, a display unit 402, an operating unit 403, and a controller 404. Controller 404 performs necessary communications with vehicle 1 via communication unit 401, according to an operator's operation of operating unit 403, thereby diagnosing the presence or absence of abnormality of vehicle 1 and displays diagnostic results on display unit 402.

Smartphone 5 includes a communication module 501, a touch panel display 502, and a controller 503. Through communications with vehicle 1 via communication module 501, controller 503 can display various information about vehicle 1 on touch panel display 502, receive user operations on touch panel display 502, etc.

Note that instrument panel 70 corresponds to a "display" according to the present disclosure. The "display" according to the present disclosure is not limited to instrument panel 70, and may be car navigation system 80, service tool 4, or smartphone 5. ECU 100 included in vehicle 1, controller 404 included in service tool 4, and controller 503 included in smartphone 5 each correspond to a "controller" according to the present disclosure.

Figure 2:
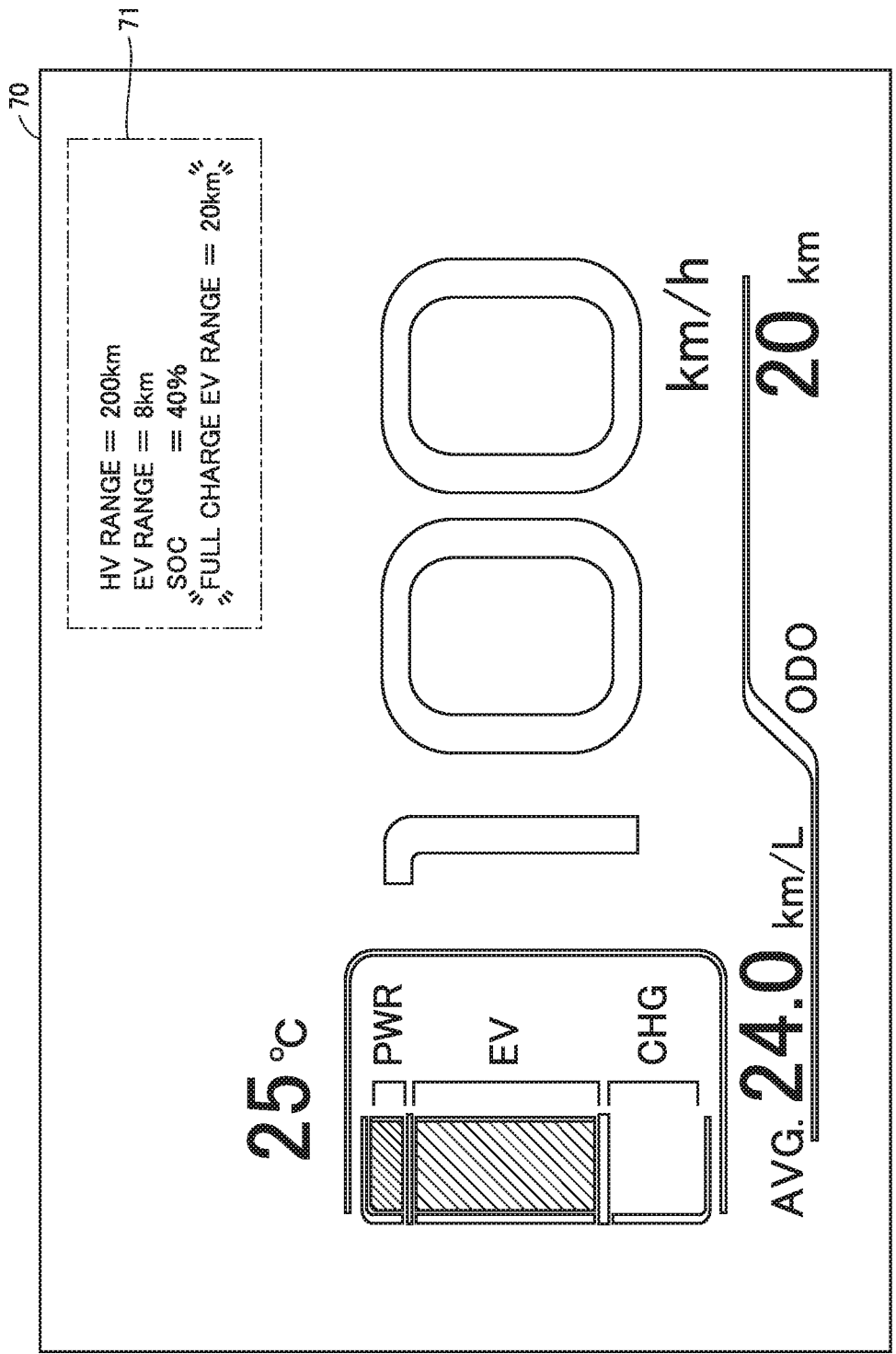
FIG. 2 is a diagram illustrating an example display mode of an instrument panel 70 according to the embodiment.

FIG. 2 is a diagram illustrating an example display mode of instrument panel 70, according to the present embodiment. Referring to FIG. 2, instrument panel 70 displays a speed per hour of vehicle 1 (100 km/h is illustrated), an average fuel economy of vehicle 1 (24.0 kmfL), the travel distance of vehicle 1 (20 km), the outdoor air temperature (25 degrees Celsius), and indicator 71 which indicates a status of battery 50 (such as SOC and the full charge capacity). As indicator 71, an indication indicative of an amount of battery remained in the secondary battery, an indication indicative of the state of health of the secondary battery, such as the full charge capacity, and an indication indicative of a fuel level are displayed (here, display according to Variation 3 is shown, including the EIV range (200 km), the EV range (8 km), SOC (40%), and the full charge EV range (20 km)).

<Battery Display Process>

In a battery display process, when the first indication indicative of the state of health of the secondary battery, such as the full charge capacity, and the second indication indicative of an amount of battery remained in the secondary battery, such as SOC, are displayed simultaneously on the same screen, it may be difficult for a user to intuitively be aware of distinction between the first indication and the second indication, such as the user being confused between the two. Moreover, in general, the second indication, such as SOC, has been more pervasive over the first indication, such as the full charge capacity, and thus the first indication may be misunderstood as the second indication. Due to this, the first indication may be mistaken as the second indication. The indication of the full charge capacity can be displayed together with SOC on a smartphone, by the user performing a predetermined operation. However, this requires the predetermined user operation. Thus, user effort is required to display the full charge capacity.

Thus, in the present embodiment, the controller (e.g., ECU 100) controls instrument panel 70 so that instrument panel 70 continuously displays the second indication that is related to the battery and different from the first indication indicative of the full charge capacity of battery 50, and controls instrument panel 70 so that instrument panel 70 (i) does not display the first indication when a predetermined condition does not hold true, and (ii) displays the first indication when the predetermined condition holds true, the predetermined condition being different from the condition that a display-related user operation has been performed. This allows the user to determine that the first indication displayed on instrument panel 70 when the predetermined condition holds true is different from the second indication and indicates the full charge capacity of battery 50. As a result, when the first indication indicative of the full charge capacity of battery 50 and the second indication different from the first indication are simultaneously displayed, the first indication can be prevented from being mistaken as the second indication, without requiring a display-related user operation.

Hereinafter, details of the present embodiment will be described, with reference to a flowchart of FIG. 2. While the flowchart illustrates an example in which indicator 71 indicative of the status of battery 50 is displayed on instrument panel 70, it should be noted that the icon can be displayed on other displays (car navigation system 80, service tool 4, or smartphone 5) as well.

<Process Flow>

Figure 3:
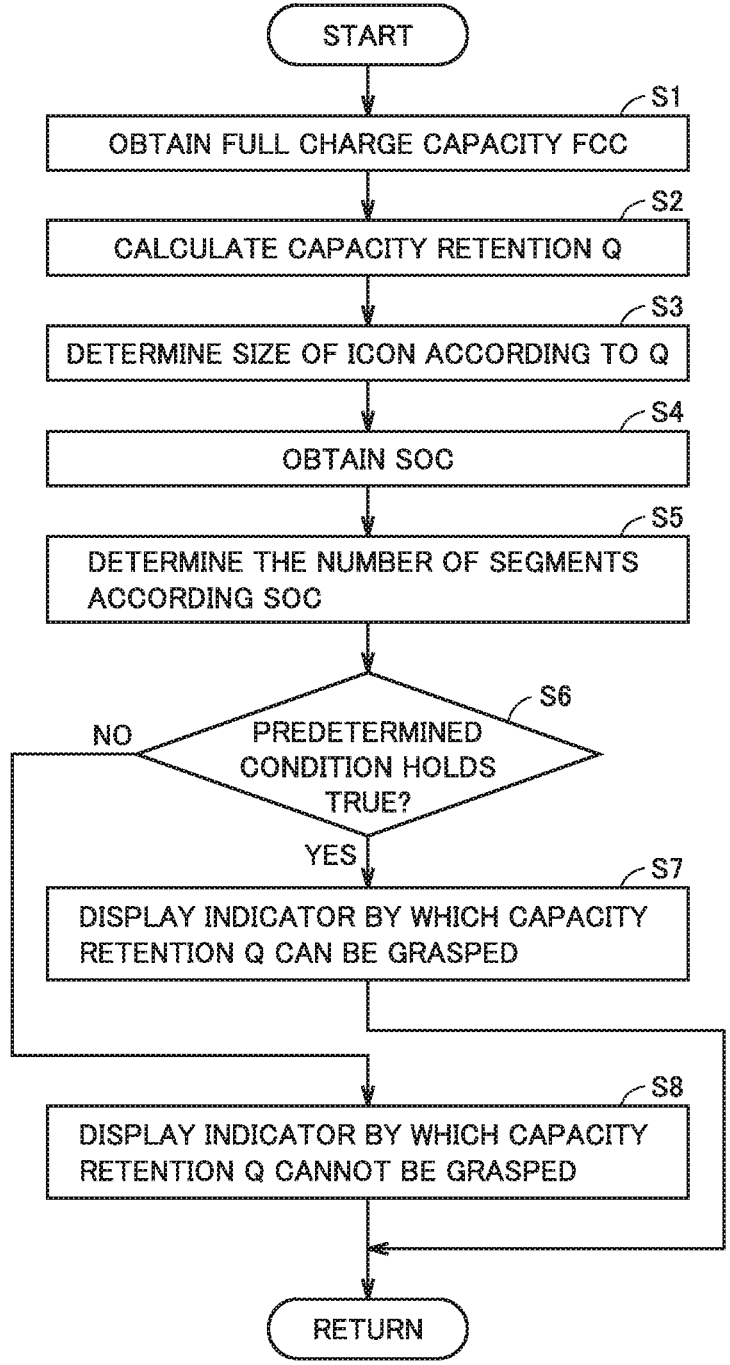
FIG. 3 is a flowchart illustrating a battery display process according to the embodiment.

FIG. 3 is a flowchart illustrating a battery display process according to the present embodiment. The flowchart is performed by ECU 100 for each predetermined control cycle, for example. Each step included in the flowchart, while it is implemented basically by software processing by ECU 100, may be implemented by dedicated hardware (electric circuits) fabricated within ECU 100. Note that, in the following, step will be abbreviated as "S."

Referring to FIG. 3, in S1, ECU 100 obtains full charge capacity FCC of battery 50. ECU 100 can calculate full charge capacity FCC of battery 50, for example, during the plug-in charging of vehicle 1, store full charge capacity FCC in a memory (not shown), and read the value of full charge capacity FCC.

A well-known approach can be employed as the calculation approach of full charge capacity FCC. For example, ECU 100 calculates SOC of battery 50 upon initiation of plug-in charging. This SOC will be called "initial SOC," and described as SOC1. Then, ECU 100 calculates an amount of power ΔAh charged in and discharged from battery 50 since the estimated time of the initial SOC. The amount of power ΔAh can be calculated by integrating the value of current flow through battery 50, using the current sensor included in monitoring unit 51. ECU 100 then calculates SOC of battery 50 again. This SOC will be called "final SOC" and described as SOC2. In that case, ECU 100 can calculate full charge capacity FCC of battery 50, according to Equation (1) below.

$$FCC = \Delta Ah / |SOC1 - SOC2| * 100 \qquad (1)$$

In S2, ECU 100 calculates capacity retention Q of battery 50. Capacity retention Q of battery 50 refers to a percentage [unit: %] of full charge capacity FCC of battery 50 at the current time over full charge capacity FCC0 of battery 50 in the initial status. Capacity retention Q is calculated by Equation (2) below. Note that initial value FCC0 of the full charge capacity may be the full charge capacity measured during manufacturing of battery 50 (or vehicle 1), or a specification value (catalog value) of the full charge capacity of battery 50.

$$Q = FCC/FCC0 * 100 \qquad (2)$$

However, the following process can be performed using full charge capacity FCC, without requiring conversion of full charge capacity FCC into capacity retention Q. Alternatively, the EV travel range retention of vehicle 1 may be used, instead of full charge capacity FCC or capacity retention Q of battery 50. The EV travel range retention refers to a percentage [unit: %] of the EV travel range of vehicle 1 at the current time over the EV travel range of vehicle 1 in the initial status. The EV travel range is calculated by multiplying the full charge capacity of battery 50 by the power consumption efficiency of vehicle 1 (power consumption per unit of distance traveled). The EV travel range is proportional to the full charge capacity, and thus the EV travel range retention indicates the same value as that of the capacity retention Q. Note that full charge capacity FCC, capacity retention Q, and the EV travel range retention each correspond to a "first indication" according to the present disclosure.

In S3, ECU 100 determines a size of the icon (the display area of the icon), according to capacity retention Q calculated in S2 when a predetermined condition holds true.

Figure 4:
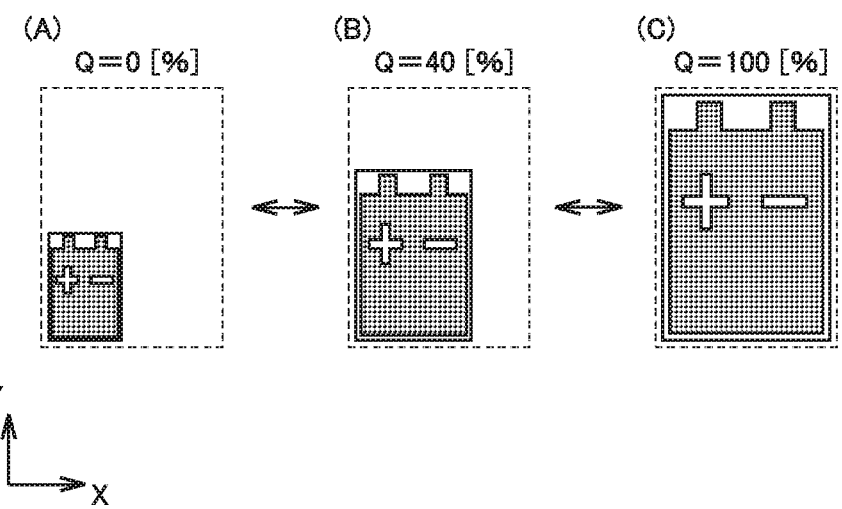
FIG. 4 is a diagram for illustrating an icon size determination approach.

FIG. 4 is a diagram for illustrating an icon size determination approach. Referring to FIG. 3, in the present embodiment, the status of battery 50 is displayed by an icon which is an abstraction of the shape of a case of a typical battery cell (such as a dry battery).

The icon display area represents capacity retention Q of battery 50. In the example shown in FIG. 4, the shapes of the icons are the same, irrespective of capacity retention Q of battery 50, and the icons are mutually congruent. Stated differently, the display area of the icon increases or decrease horizontally (X direction) and vertically (Y direction), while keeping a ratio of the height and the width (aspect ratio) of the icon. Note that for comparison, the display size of the icon when capacity retention Q of battery 50 is 100% is indicated by the dashed lines.

The higher the capacity retention Q of battery 50, the larger the display area of the icon. As shown in (A) of FIG. 4, the display area of the icon when capacity retention Q is 0% is a predetermined minimum area Amin. As shown in (C) of FIG. 4, when capacity retention Q is 100%, the display area of the icon is a predetermined maximum area Amax. As shown in (B) of FIG. 4, when capacity retention Q is above 0% and less than 100% (Q=40% in this example), the display area of the icon is determined so as to be proportional to capacity retention Q between minimum area Amin and maximum area Amax.

Returning to FIG. 3, in S4, ECU 100 obtains the current SOC of battery 50. ECU 100 then determines the number of segments displayed within the icon, according to the SOC obtained in S4 (S5).

Figure 5:
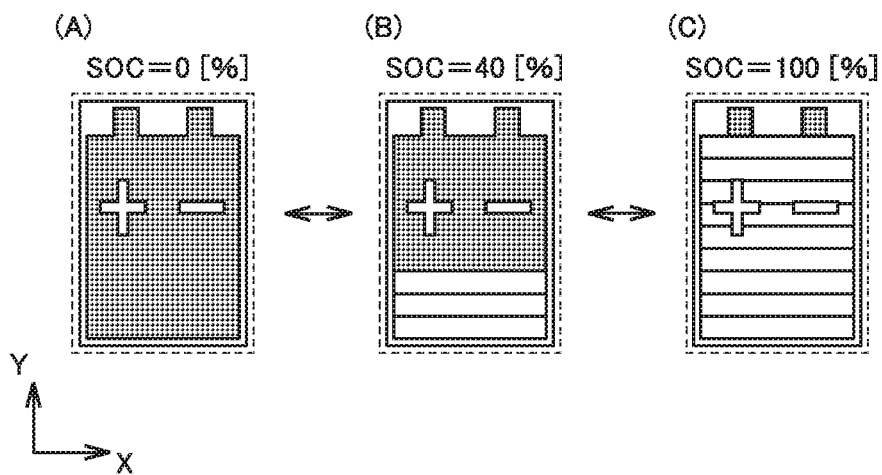
FIG. 5 is a diagram for illustrating an approach for determining the number of segments displayed in an icon.

FIG. 5 is a diagram for illustrating an approach for determining the number of segments displayed in the icon. Referring to FIG. 5, the number of segments displayed in the icon represents SOC of battery 50. In the example shown in FIG. 5, the number of segments in the icon increases or decreases vertically (Y direction) with variations in SOC of battery 50.

The higher the SOC of battery 50, the more the number of segments displayed. As shown in (A) of FIG. 5, when SOC is 0%, the number of segments is a predetermined minimum number Nmin (zero in this example). As shown in (C) of FIG. 5, when SOC is 100%, the number of segments is a predetermined maximum number Nmax (nine in this example). As shown in (B) of FIG. 5, when SOC is above 0% and less than 100% (Q=40% in this example), the number of segments is determined so as to be proportional to SOC between minimum number Nmin and maximum number Nmax. Note that the number of segments being Nmin is not limited to indicate that SOC is 0%. The number of segments being Nmin may indicate SOC when vehicle 1 is short of electricity and rendered inoperable, or SOC when the control is forced to switch from running vehicle 1 with the motor-generator only to running vehicle 1 with the engine only. The number of segments being Nmax is also not limited to indicate that SOC is 100%. The number of segments being Nmax may indicate SOC when a control for ending charging of vehicle 1 is performed so as to prevent overcharging. The way the number of segments increases or decreases is also not limited to be proportional to SOC. For example, the greater the SOC decreases, the faster the number of segments may decrease.

Referring again to FIG. 3, in S6, ECU 100 determines whether a predetermined condition holds true. In the present embodiment, the predetermined condition is an OR condition between the following four conditions: a condition that it has been within a predetermined time period (e.g., tens of seconds, a few minutes) since update of the display content of the first indication indicative of the full charge capacity; a condition that it has been within a predetermined time period (e.g., tens of seconds, a few minutes) since startup of vehicle 1; a condition that it has been within a predetermined time period (e.g., tens of seconds, a few minutes) since completion of charging of battery 50 through external charging; and a condition that an operation for displaying the first indication (e.g., an operation on the switch for displaying the first indication) has been performed. However, the present disclosure is not limited thereto. The predetermined condition may be an AND condition of the above four conditions, an OR condition or an AND condition of any two or three of the above four conditions, any one of the above four conditions, or any other condition insofar as the condition is suitable for displaying the first indication indicative of the full charge capacity.

Note that even if vehicle 1 has an operating unit for displaying some indication on instrument panel 70, such as an operating unit for displaying the first indication, the predetermined condition may not include the condition that a display-related operation, such as an operation for displaying the first indication, has been performed. Moreover, if vehicle 1 does not have an operating unit for displaying some indication on instrument panel 70, such as an operating unit for displaying the first indication, the predetermined condition does not include the condition that the display-related operation, such as an operation for displaying the first indication, has been performed. This makes the present embodiment applicable to vehicle 1 that does not have an operating unit for displaying some indication on instrument panel 70, such as an operating unit for displaying the first indication.

When ECU 100 determines that the predetermined condition holds true (YES in S6), ECU 100, in S7, continuously shows SOC of battery 50 in accordance with the display area determined in S3 and the number of segments determined in S4, and displays on instrument panel 70 the indicator 71 by which the user is able to grasp capacity retention Q of battery 50.

FIG. 6 is a diagram illustrating an example of indicator 71 displayed on instrument panel 70, according to Embodiment 1. For example, when SOC of battery 50 is 40% and capacity retention Q of battery 50 is 40%, indicator 71, as shown in (B) of FIG. 4, is displayed in a mode by which the user is able to grasp capacity retention Q, as shown by the icon on the right hand side in indicator 71 of (B) of FIG. 6. Note that the icon on the left hand side of the figure indicates a fuel level.

Returning to FIG. 3, if ECU 100 determines that the predetermined condition does not hold true (normal conditions) (NO in S6), ECU 100, in S8, continuously shows SOC of battery 50 in accordance with the number of segments determined in S4, and displays on instrument panel 70 the indicator 71 by which the user is unable to grasp capacity retention Q of battery 50.

Referring again to FIG. 6, for example, when SOC of battery 50 is 40%, indicator 71 is displayed in a mode in which the user is unable to grasp capacity retention Q (i.e., a mode in which the display area of the icon does not vary depending on capacity retention Q), as shown by the icon on the right hand side in indicator 71 of (A) of FIG. 6.

Generally, as the battery is deteriorated and the capacity retention decreases, the amount of power that can be charged in the battery decreases. In this respect, the capacity retention is an indication that represents the size of a "container" storing the power. In the present embodiment, capacity retention Q of battery 50 is represented in terms of the display area of the icon (icon size) of the segment display. The icon size decreases with a reduction of capacity retention Q of battery 50, that is, reduction in size of the "container." This allows the user to intuitively understand that the full charge capacity of battery 50 is decreasing.

Variation 1 of Embodiment 1

In the embodiment described above, SOC of battery 50 and capacity retention Q are indicated by an icon, as shown in FIG. 6. However, the present disclosure is not limited thereto. SOC and capacity retention Q of battery 50 may be indicated numerically.

FIG. 7 is a diagram showing indicator 71 displayed on instrument panel 70 according to Variation 1 of Embodiment 1. Referring to FIG. 7, normally, which is when the predetermined condition does not hold true, a fuel level and SOC of battery 50 are represented numerically as shown in (A) of FIG. 7. When the predetermined condition holds true, capacity retention Q is represented numerically, in addition to the fuel level and SOC of battery 50, as shown in (B) of FIG. 7. Capacity retention Q is displayed in a flashing state so that the user can readily grasp it. Note that capacity retention Q may be displayed in a color different from SOC.

Variation 2 of Embodiment 1

In the above embodiment and Variation 1 thereof, capacity retention Q is displayed by an icon and in a numerical value as the first indication indicative of the full charge capacity of battery 50. SOC is also displayed by an icon and in a numerical value, respectively, as the second indication indicative of the amount of battery remained in battery 50. However, the present disclosure is not limited thereto. A cruising range for vehicle 1 at full charge of battery 50 and a cruising range for vehicle 1 with the amount of battery remained in battery 50 may be displayed as the first indication and the second indication, respectively.

FIG. 8 is a diagram showing indicator 71 displayed on instrument panel 70, according to Variation 2 of Embodiment 1. Referring to FIG. 8, normally, which is when the predetermined condition does not hold true, (i) a HV range in which vehicle 1 can travel with the amount of fuel remained and the amount of battery remained, (ii) an EV range in which vehicle 1 can travel only with the remaining amount of battery, and (iii) SOC of battery 50 are represented numerically, as shown in (A) of FIG. 8. When the predetermined condition holds true, a full charge EV range, which is a cruising range for vehicle 1 at full charge of battery 50, is represented numerically, in addition to the HV range, the EV range, and SOC of battery 50, as shown in (B) of FIG. 8. The full charge EV range is displayed in a flashing state so that the user can readily grasp it. Note that the full charge EV range may be displayed in a color different from those of the other indications. Moreover, any one of the EV range and SOC may be hidden.

Variation 3 of Embodiment 1

In Variation 2 described above, when the EV range is displayed as the second indication indicative of the amount of battery remained in battery 50, the full charge EV range is displayed as the first indication indicative of the full charge capacity of battery 50, as shown in (B) of FIG. 8. However, the present disclosure is not limited thereto. Capacity retention Q may be represented numerically as the first indication indicative of the full charge capacity of battery 50 even when the EV range is displayed as the second indication.

FIG. 9 is a diagram showing indicator 71 displayed on instrument panel 70, according to Variation 3 of Embodiment 1. Referring to FIG. 9, (A) of FIG. 9 is the same as (A) of FIG. 8. While a full charge EV range is displayed as shown in (B) of FIG. 8 in Variation 2, capacity retention Q is displayed as shown in (B) of FIG. 9 in Variation 3. Note that any one of the EV range and SOC may be hidden.

Embodiment 2

In Embodiment 1, vehicle 1 is a plug-in hybrid vehicle. In Embodiment 2, a vehicle 1A is an electric vehicle.

Figure 10:
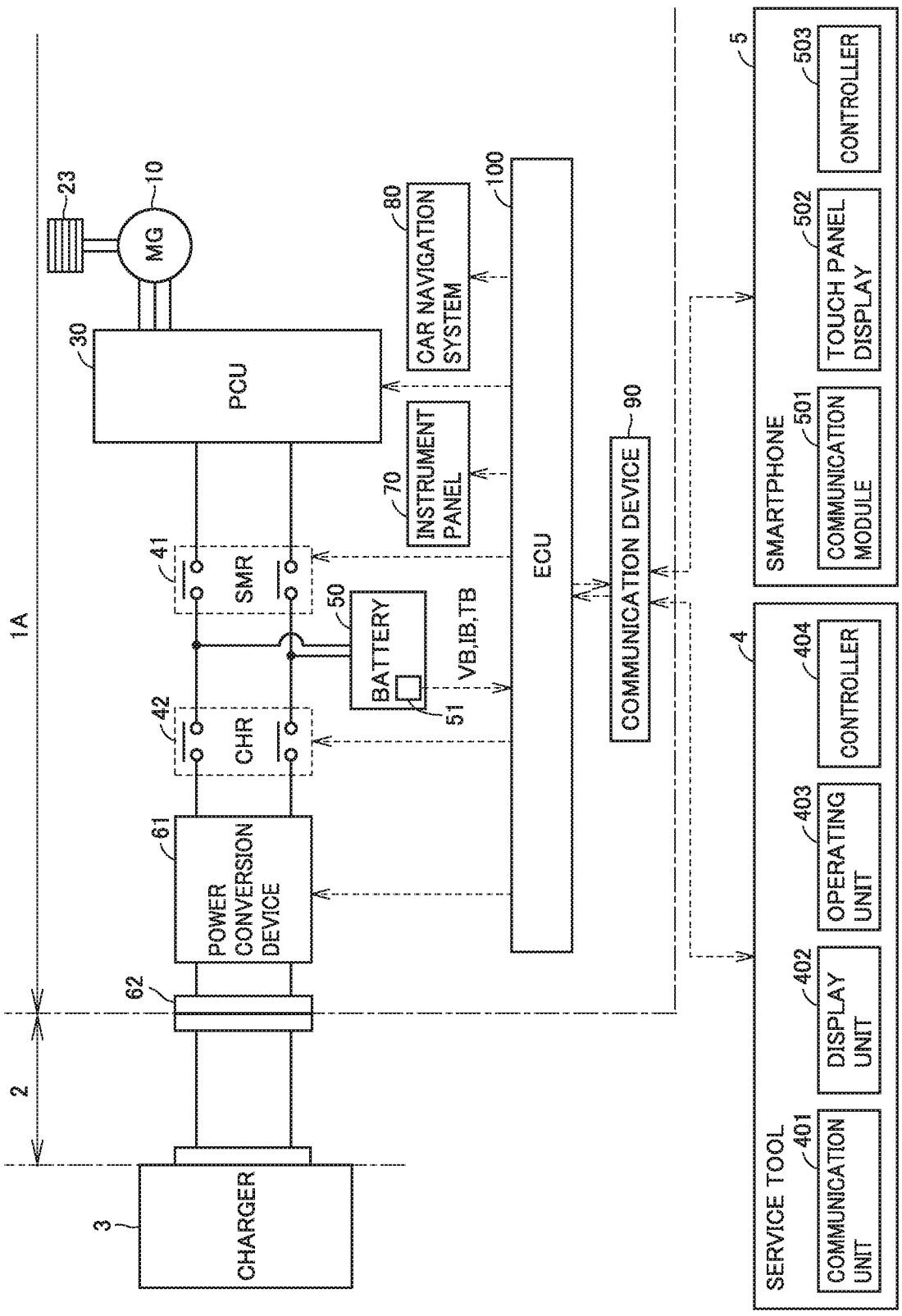
FIG. 10 is a diagram schematically showing an overall configuration of a system, including a vehicle according to Embodiment 2 of the present disclosure.

FIG. 10 is a diagram schematically showing an overall configuration of a system, including a vehicle according to Embodiment 2 of the present disclosure. Referring to FIG. 10, unlike Embodiment 1, vehicle 1A according to Embodiment 2 does not include engine 21, and includes one motor generator 10. Motor generator 10 has the same functionality as motor generator 12 according to Embodiment 1. The other configurations of vehicle 1A according to Embodiment 2 are the same as those of vehicle 1 according to Embodiment 1.

Figure 11:
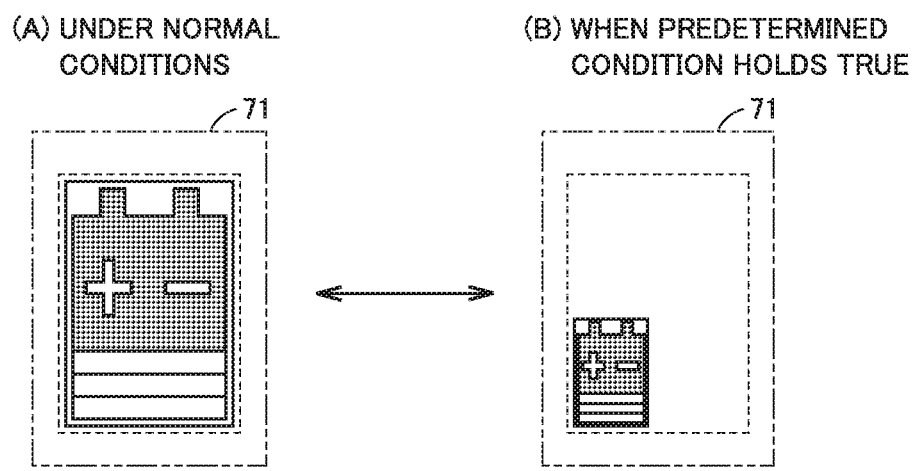
FIG. 11 is a diagram illustrating an example indicator displayed on an instrument panel, according to Embodiment 2.

FIG. 11 is a diagram illustrating an example of indicator 71 displayed on instrument panel 70, according to Embodiment 2. Referring to FIG. 11, since vehicle 1A according to Embodiment 2 includes no engine, a fuel level is not displayed, unlike indicator 71 according to Embodiment 1 shown in FIG. 6.

Variations 1 Through 3 of Embodiment 2

FIGS. 12, 13, and 14 are diagrams showing an indicator displayed on an instrument panel according to Variation 1, Variation 2, and Variation 3, respectively, of Embodiment 2. Referring to FIGS. 12 through 14, indicators 71 displayed in these figures are those shown in FIGS. 7 through 9 according to Embodiment 1, without including the icon or the numerical value that indicate the fuel level in the display of indicator 71. Note that any one of the range and SOC may be hidden in FIGS. 13 and 14.

Other Variations (1) In the embodiments described above, the first indication indicative of the full charge capacity of battery 50 is represented in terms of the display area of the icon or in a numerical value, as shown in FIGS. 6 through 9. When the full charge capacity of battery 50 is represented numerically, the numerical value is in the flashing display. However, the present disclosure is not limited thereto. The first indication may be displayed in a display mode different from the second indication indicative of the amount of battery remained in battery 50 (e.g., a different display color, the numerical value in a different font size).

(2) In the embodiments described above, SOC of battery 50 is indicated in terms of the number of segments and capacity retention Q of battery 50 is indicated in terms of the display area of the segment display, as shown in FIG. 6. However, the present disclosure is not limited thereto. Capacity retention Q of battery 50 may be indicated in terms of the number of segments and SOC of battery 50 may be indicated in terms of the display area of the segment display.

(3) The segment display in the embodiments described above may be replaced with other scale indication, for example, a meter indication.

(4) In the embodiments described above, the size of the icon, which indicates capacity retention Q according to capacity retention Q of battery 50, enlarges or reduces, while keeping an aspect ratio of the icon, as shown in FIG. 4. However, the present disclosure is not limited thereto. For example, the horizontal length of the icon may increase or decrease, while keeping the vertical length of the icon, or vice versa.

(5) In the embodiments described above, the shape of the icon indicating capacity retention Q of battery 50 is an abstraction of the shape of a case of a typical battery cell. However, the present disclosure is not limited thereto. The icon may have other shape, which may be the shape of a bucket or a heart shape.

(6) In the embodiments described above, ECU 100, included in vehicle 1, performs various computations, such as calculating capacity retention Q, determining the size of the icon, determining the number of segments, etc. as illustrated in S1 through S5 of FIG. 3. However, the present disclosure is not limited thereto. ECU 100, included in vehicle 1, may transmit data used to perform these various computations to an external server or the like, the server may perform the various computations, and results may be returned to vehicle 1.

Configurations and Advantageous Effects of the Above-Described Embodiments (1) As shown in FIGS. 1 and 10, the display system according to the present embodiment includes instrument panel 70, and ECU 100 for controlling instrument panel 70 so that instrument panel 70 displays the indication related to battery 50. As shown in FIG. 3, ECU 100 controls instrument panel 70 so that instrument panel 70 (S7, S8) continuously displays the second indication which is related to battery 50 (e.g., SOC, the EV range) and different from the first indication indicative of the full charge capacity of battery 50 (e.g., capacity retention Q, a full charge EV range), and controls instrument panel 70 so that instrument panel 70 (S8) does not display the first indication when a predetermined condition does not hold true, and (S7) displays the first indication when the predetermined condition holds true, the predetermined condition being different from the condition that a display-related user operation has been performed.

With this, the user is allowed to determine that the first indication displayed on instrument panel 70 when the predetermined condition holds true is an indication indicative of the full charge capacity of battery 50. As a result, when the first indication indicative of the full charge capacity of battery 50 and the second indication different from the first indication are simultaneously displayed, the first indication can be prevented from being mistaken as the second indication, without requiring a display-related user operation.

(2) As shown in FIGS. 6 through 9 and 11 through 14, the second indication is an indication (e.g., SOC, the EV range) indicating an amount of battery remained in battery 50. When the first indication is displayed, ECU 100 controls instrument panel 70 so that instrument panel 70 displays the first indication in the same screen in which the second indication is displayed.

With this, when the first indication indicative of the full charge capacity is displayed, the first indication is displayed in the same screen in which the second indication indicative of the amount of battery remained in battery 50 is displayed. As a result, when the first indication indicative of the full charge capacity of battery 50 and the second indication indicative of the amount of battery remained in battery 50 are displayed in the same screen, the first indication can be prevented from being mistaken as the second indication.

(3) The predetermined condition is that it has been within a predetermined time period since update of the display content of the first indication, as described with respect to S6 of FIG. 3.

With this, the indication indicative of the full charge capacity is displayed when the display content of the indication indicative of the full charge capacity has been updated. As a result, the user can be notified of the indication of the full charge capacity of battery 50 when there is a change in indication indicative of the full charge capacity.

(4) As shown in FIGS. 1 and 10, vehicle 1, 1A includes battery 50 and the display system described above.

With this, vehicle 1, 1A can be provided which can prevent, when the first indication indicative of the full charge capacity of battery 50 and the second indication different from the first indication are simultaneously displayed, the first indication from being mistaken as the second indication.

(5) The predetermined condition is that it has been within a predetermined time period since startup of vehicle 1, 1A, as illustrated with respect to S6 of FIG. 3.

With this, the indication indicative of the full charge capacity is displayed upon the startup of vehicle 1, 1A even if the indication indicative of the full charge capacity is not updated. As a result, users' concerns can be resolved, such as that he/she does not know whether the full charge capacity of battery 50 is varying.

(6) The predetermined condition is that it has been within a predetermined time period since completion of charging of battery 50 through external charging, as illustrated with respect to S6 of FIG. 3.

With this, the indication indicative of the full charge capacity is displayed upon the completion of charging of battery 50 even if the indication indicative of the full charge capacity is not updated. As a result, users' concerns can be resolved, such as that he/she does not know whether the full charge capacity of battery 50 is varying.

(7) ECU 100 controls the display so that the display displays, as the second indication, a cruising range for vehicle 1, 1A with the amount of battery remained in battery 50, as shown in FIGS. 8, 9, 13, and 14.

With this, the user is allowed to know the amount of battery remained in battery 50 as a cruising range for vehicle 1, 1A.

(8) ECU 100 controls instrument panel 70 so that instrument panel 70 displays, as the second indication, SOC of battery 50 and a cruising range for vehicle 1, 1A with the amount of battery remained in battery 50, as shown in FIGS. 8, 9, 13 and 14.

With this, the user is allowed to know the amount of battery remained in battery 50 in terms of a cruising range and SOC for vehicle 1, 1A.

(9) ECU 100 controls instrument panel 70 so that instrument panel 70 displays a cruising range for vehicle 1, 1A at full charge of battery 50, as the first indication, as shown in FIGS. 8 and 13.

With this, the user is allowed to know the full charge capacity of battery 50 as a cruising range for vehicle 1, 1A at full charge.

(10) As shown in FIG. 3, the method of display of the status of battery 50 is a method for displaying an indication related to battery 50, the method, including: controlling instrument panel 70 so that instrument panel 70 (S7, S8) continuously displays the second indication which is related to battery 50 and different from the first indication indicative of the full charge capacity of battery 50; and controlling instrument panel 70 so that instrument panel 70 (S8) does not display the first indication when a predetermined condition does not hold true, and (S7) displays the first indication when the predetermined condition holds true, the predetermined condition being different from a condition that a display-related user operation has been performed.

With this, a method of display of the status of battery 50 can be provided which can prevent, when the first indication indicative of the full charge capacity of battery 50 and the second indication different from the first indication are simultaneously displayed, the first indication from being mistaken as the second indication, without requiring a display-related user operation.

Although the present disclosure has been described and illustrated in detail, it is clearly understood that the same is by way of illustration and example only and is not to be taken by way of limitation, the scope of the present disclosure being interpreted by the terms of the appended claims.

What is claimed is:

1. A display system, comprising:
a display; and
a controller that controls the display so that the display displays an indication related to a secondary battery, wherein
the controller:
controls the display so that the display continuously displays a second indication which is related to the secondary battery and different from a first indication indicative of a full charge capacity of the secondary battery; and controls the display so that the display does not display the first indication when a predetermined condition does not hold true, and displays the first indication when the predetermined condition holds true, the predetermined condition being different from a condition that a display-related user operation has been performed.

2. The display system according to claim 1, wherein the second indication is an indication indicative of an amount of battery remained in the secondary battery, and the controller controls the display so that the display displays the first indication in a same screen in which the second indication is displayed.

3. A vehicle, comprising
the secondary battery; and
the display system according to claim 1.

4. The vehicle according to claim 3, wherein
the predetermined condition is that it has been within a predetermined time period since startup of the vehicle.

5. The vehicle according to claim 3, wherein
the predetermined condition is that it has been within a predetermined time period since completion of charging of the secondary battery through external charging.

6. The vehicle according to claim 3, wherein
the controller controls the display so that the display displays, as the second indication, a cruising range for the vehicle with an amount of battery remained in the secondary battery.

7. The vehicle according to claim 3, wherein
the controller controls the display so that the display displays, as the second indication, an SOC of the secondary battery and a cruising range for the vehicle with an amount of battery remained in the secondary battery.

8. The vehicle according to claim 3, wherein
the controller controls the display so that the display displays, as the first indication, a cruising range for the vehicle at full charge of the secondary battery.

9. A display system, comprising:
a display; and
a controller that controls the display so that the display displays an indication related to a secondary battery, wherein
the controller:
controls the display so that the display continuously displays a second indication which is related to the secondary battery and different from a first indication indicative of a full charge capacity of the secondary battery; and
controls the display so that the display does not display the first indication when a predetermined condition does not hold true, and displays the first indication when the predetermined condition holds true, the predetermined condition being different from a condition that a display-related user operation has been performed, wherein
the predetermined condition is that it has been within a predetermined time period since update of display content of the first indication.

10. A method of display of a status of a secondary battery by displaying an indication related to the secondary battery, the method comprising:
controlling a display so that the display continuously displays a second indication related to the secondary battery different from a first indication indicative of a full charge capacity of the secondary battery; and
controlling the display so that the display does not display the first indication when a predetermined condition does not hold true, and displays the first indication when the predetermined condition holds true, the predetermined condition being different from a condition that a display-related user operation has been performed.

* * * * *